(12) United States Patent
Kim

(10) Patent No.: US 10,454,047 B2
(45) Date of Patent: Oct. 22, 2019

(54) FLEXIBLE DISPLAY DEVICE

(71) Applicant: SAMSUNG DISPLAY CO., LTD., Yongin-si, Gyeonggi-do (KR)

(72) Inventor: Minsoo Kim, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 59 days.

(21) Appl. No.: 15/428,566

(22) Filed: Feb. 9, 2017

(65) Prior Publication Data
US 2017/0309843 A1   Oct. 26, 2017

(30) Foreign Application Priority Data

Apr. 21, 2016  (KR) .......................... 10-2016-0048496

(51) Int. Cl.
*B32B 3/24* (2006.01)
*B32B 3/26* (2006.01)
(Continued)

(52) U.S. Cl.
CPC ............ *H01L 51/0097* (2013.01); *B32B 3/26* (2013.01); *B32B 3/266* (2013.01); *B32B 3/30* (2013.01); *B32B 7/02* (2013.01); *B32B 7/12* (2013.01); *B32B 5/14* (2013.01); *B32B 7/022* (2019.01); *B32B 2307/50* (2013.01); *B32B 2307/72* (2013.01); *B32B 2457/20* (2013.01); *B32B 2457/206* (2013.01); *B32B 2457/208* (2013.01); *G02F 1/133305* (2013.01); *G06F 2203/04102* (2013.01); *H01L 27/323* (2013.01); *H01L 27/3244* (2013.01); *H01L 51/5281* (2013.01); *H01L 2251/5338* (2013.01); *Y02E 10/549* (2013.01); *Y10T 428/24298* (2015.01); *Y10T 428/24331* (2015.01); *Y10T 428/24562* (2015.01); *Y10T 428/24612* (2015.01);
(Continued)

(58) Field of Classification Search
None
See application file for complete search history.

(56) References Cited

U.S. PATENT DOCUMENTS

| 5,254,388 | A | * | 10/1993 | Melby | ..................... | G02B 5/00 348/E5.131 |
| 8,647,727 | B1 | * | 2/2014 | Barnidge | ............. | G02B 5/0242 156/60 |

(Continued)

FOREIGN PATENT DOCUMENTS

| CN | 103187007 A | * | 7/2013 |
| CN | 103955306 A | * | 7/2014 |

(Continued)

OTHER PUBLICATIONS

Machine Translation of JP 2011027822 A, Feb. 2011 (Year: 2011).*

*Primary Examiner* — Jeffrey A Vonch
(74) *Attorney, Agent, or Firm* — Kile Park Reed & Houtteman PLLC

(57) ABSTRACT

A flexible display device includes a display panel, the display panel including a display surface and a rear surface opposite each other, and a plurality of adhesive films on at least one of the display surface and the rear surface, each of the plurality of adhesive films including at least one hole, wherein the plurality of adhesive films have a decreasing density, as a distance from a neutral plane of the flexible display device increases.

24 Claims, 12 Drawing Sheets

(51) Int. Cl.
  *B32B 3/30*    (2006.01)
  *B32B 7/02*    (2019.01)
  *B32B 7/12*    (2006.01)
  *H01L 51/00*   (2006.01)
  *H01L 27/32*       (2006.01)
  *G02F 1/1333*      (2006.01)
  *B32B 7/022*       (2019.01)
  *B32B 5/14*        (2006.01)
  *H01L 51/52*       (2006.01)

(52) U.S. Cl.
  CPC ............ *Y10T 428/24942* (2015.01); *Y10T 428/249921* (2015.04); *Y10T 428/249978* (2015.04); *Y10T 428/249982* (2015.04); *Y10T 428/249987* (2015.04)

(56) References Cited

U.S. PATENT DOCUMENTS

| | | | |
|---|---|---|---|
| 2001/0053648 A1* | 12/2001 | Furukawa | B32B 17/06 445/24 |
| 2002/0027636 A1* | 3/2002 | Yamada | G02F 1/133305 349/155 |
| 2003/0174396 A1* | 9/2003 | Murayama | G03B 21/62 359/453 |
| 2006/0083894 A1* | 4/2006 | Vetrovec | B29C 63/0047 428/137 |
| 2006/0087865 A1* | 4/2006 | Ha | G02B 5/0242 362/607 |
| 2007/0062639 A1* | 3/2007 | Chang | B32B 37/1292 156/291 |
| 2008/0153377 A1* | 6/2008 | Kobayashi | G02F 1/133308 445/24 |
| 2009/0075055 A1 | 3/2009 | Vetrovec et al. | |
| 2010/0308335 A1* | 12/2010 | Kim | H01L 27/3244 257/59 |
| 2011/0143072 A1 | 6/2011 | Ross | |
| 2012/0287677 A1* | 11/2012 | Wheatley | G02B 6/0051 362/627 |
| 2014/0042406 A1* | 2/2014 | Degner | H01L 27/326 257/40 |
| 2014/0071653 A1* | 3/2014 | Thompson | G02B 6/005 362/19 |
| 2014/0078582 A1* | 3/2014 | Cho | G02B 5/3025 359/485.03 |
| 2014/0091288 A1* | 4/2014 | Lee | H01L 51/5256 257/40 |
| 2014/0118269 A1* | 5/2014 | Kim | G06F 3/044 345/173 |
| 2014/0145167 A1* | 5/2014 | Son | H01L 51/0097 257/40 |
| 2014/0226111 A1* | 8/2014 | Kim | G02F 1/133305 349/96 |
| 2014/0267950 A1* | 9/2014 | Kang | G06F 1/1652 349/12 |
| 2014/0295150 A1* | 10/2014 | Bower | C09J 5/00 428/201 |
| 2014/0354558 A1* | 12/2014 | Cho | G06F 3/0412 345/173 |
| 2014/0367644 A1* | 12/2014 | Song | H01L 51/0097 257/40 |
| 2015/0004345 A1* | 1/2015 | Chaung | B32B 7/14 428/41.7 |
| 2015/0009632 A1* | 1/2015 | Min | H05K 7/02 361/728 |
| 2015/0086740 A1* | 3/2015 | Shin | B32B 37/0076 428/41.8 |
| 2015/0102325 A1* | 4/2015 | Lim | G02B 5/0242 257/40 |
| 2015/0144913 A1* | 5/2015 | Shim | C09J 7/00 257/40 |
| 2015/0147532 A1* | 5/2015 | Nam | H01L 51/524 428/172 |
| 2015/0181731 A1* | 6/2015 | Lin | B32B 37/12 361/749 |
| 2015/0185782 A1* | 7/2015 | Kim | G06F 1/1652 349/12 |
| 2015/0200375 A1* | 7/2015 | Kim | G09F 9/301 257/40 |
| 2015/0227172 A1* | 8/2015 | Namkung | G06F 1/1652 345/173 |
| 2015/0266272 A1* | 9/2015 | Lee | B32B 17/064 428/189 |
| 2015/0268697 A1* | 9/2015 | Nam | G06F 1/1652 428/157 |
| 2016/0037656 A1* | 2/2016 | Kim | G06F 1/1656 361/749 |
| 2016/0084994 A1* | 3/2016 | Namkung | G02B 1/14 345/173 |
| 2016/0093685 A1* | 3/2016 | Kwon | H01L 27/3276 257/40 |
| 2016/0109631 A1* | 4/2016 | Mizutani | C09J 7/38 156/249 |
| 2016/0111678 A1* | 4/2016 | Lee | C09J 7/00 257/40 |
| 2016/0155967 A1* | 6/2016 | Lee | H01L 51/5281 257/88 |
| 2016/0255713 A1* | 9/2016 | Kim | G02F 1/133305 361/749 |
| 2016/0268542 A1* | 9/2016 | Suzuki | G06F 3/041 |
| 2016/0282653 A1* | 9/2016 | Hu | G06F 3/041 |
| 2016/0282661 A1* | 9/2016 | Nam | G02F 1/133305 |
| 2016/0303843 A1* | 10/2016 | Jang | B32B 37/0084 |
| 2016/0380033 A1* | 12/2016 | Lee | H01L 27/323 257/40 |
| 2017/0092884 A1* | 3/2017 | Zhang | H01L 51/0097 |
| 2017/0141348 A1* | 5/2017 | Yu | H01L 51/56 |
| 2017/0166786 A1* | 6/2017 | Moon | C09J 133/066 |
| 2017/0229665 A1* | 8/2017 | Park | H01L 51/0097 |
| 2017/0321087 A1* | 11/2017 | Moon | G06F 3/041 |
| 2018/0187051 A1* | 7/2018 | Won | C09J 7/385 |

FOREIGN PATENT DOCUMENTS

| | | | | |
|---|---|---|---|---|
| CN | 103985321 A | * | 8/2014 | |
| JP | 2009141060 A | * | 6/2009 | |
| JP | 2011027822 A | * | 2/2011 | |
| JP | 2011090891 A | * | 5/2011 | |
| KR | 20120130919 A | * | 12/2012 | |
| KR | 20140143979 A | * | 12/2014 | |
| KR | 10-2015-0018934 A | | 2/2015 | |
| KR | 20150018934 A | * | 2/2015 | |
| KR | 10-2015-0042937 A | | 4/2015 | |
| KR | 20150080910 A | * | 7/2015 | |
| WO | WO-2017014207 A1 | * | 1/2017 | ............ H02P 25/024 |
| WO | WO-2017135651 A1 | * | 8/2017 | ........... G02F 1/1333 |

\* cited by examiner

FLEXIBLE DISPLAY DEVICE

CROSS-REFERENCE TO RELATED APPLICATION

Korean Patent Application No. 10-2016-0048496, filed on Apr. 21, 2016, in the Korean Intellectual Property Office, and entitled: "Flexible Display Device," is incorporated by reference herein in its entirety.

BACKGROUND

1. Field

Embodiments relate to a display device, and more particularly, to a flexible display device that may significantly reduce (e.g., minimize) stress imposed thereon, when being curved.

2. Description of the Related Art

A flexible display device (or a foldable display device) includes a flexible panel which may be curved. The flexible display device may be highly portable and, when unfolded, may realize a large screen. The flexible display device may be applied to various fields, e.g., a television and a monitor, in addition to a mobile device, e.g., an electronic book and an electronic newspaper.

SUMMARY

According to an exemplary embodiment, a flexible display device includes a display panel, and a plurality of adhesive films on at least one of a display surface or a rear surface of the display panel, the plurality of adhesive films each have at least one hole. The plurality of adhesive films may have a lower density, as further away from a neutral plane of the flexible display device.

At least two of the plurality of adhesive films may have different densities from one another due to the hole, and the plurality of adhesive films may have a higher hole density, as further away from the neutral plane.

Each of the holes of the adhesive films may have substantially a same size.

The plurality of adhesive films may have a greater number of holes, as further away from the neutral plane.

Each of the adhesive films may have a same number of holes.

The plurality of adhesive films may have holes of a greater size, as further away from the neutral plane.

The plurality of adhesive films may have a greater number of holes which have a smaller size, as further away from the neutral plane.

The plurality of adhesive films may have a smaller number of holes which have a greater size, as further away from the neutral plane.

Each of the adhesive films may include: a first adhesion surface; a second adhesion surface; and a base portion between the first adhesion surface and the second adhesion surface.

The hole may pass through the first adhesion surface, the base portion, and the second adhesion surface.

The neutral plane may be positioned in the display panel.

The flexible display device may further include an adhesive inserted into the hole.

The adhesive may have a refractive index different from that of the adhesive film.

The adhesive may have substantially a same size as that of the hole.

The plurality of adhesive films may have adhesion surfaces of a smaller planar area, as further away from the neutral plane.

According to an exemplary embodiment, a flexible display device includes: a display panel; and a plurality of adhesive films on at least one of a display surface or a rear surface of the display panel, the plurality of adhesive films each have at least one groove. The plurality of adhesive films may have a lower density, as further away from a neutral plane of the flexible display device.

At least two of the plurality of adhesive films may have different densities from one another due to the groove, and the plurality of adhesive films may have a higher groove density, as further away from the neutral plane.

Each of the adhesive films may include: a first adhesion surface; a second adhesion surface; and a base portion between the first adhesion surface and the second adhesion surface.

The groove may pass through one of the first adhesion surface and the second adhesion surface.

The groove may include: a first groove passing through the first adhesion surface; and a second groove passing through the second adhesion surface.

The first groove and the second groove may oppose each other.

The plurality of adhesive films may have adhesion surfaces of a smaller planar area, as further away from the neutral plane.

According to an exemplary embodiment, a flexible display device includes: a display panel; and a plurality of adhesive films on at least one of a display surface or a rear surface of the display panel, the plurality of adhesive films each have at least one pore. The plurality of adhesive films may have a lower density, as further away from a neutral plane of the flexible display device.

At least two of the plurality of adhesive films may have different densities from one another due to the pore, and the plurality of adhesive films may have a higher pore density, as further away from the neutral plane.

Each of the adhesive films may include: a first adhesion surface; a second adhesion surface; and a base portion between the first adhesion surface and the second adhesion surface.

The pore may be positioned in the base portion.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
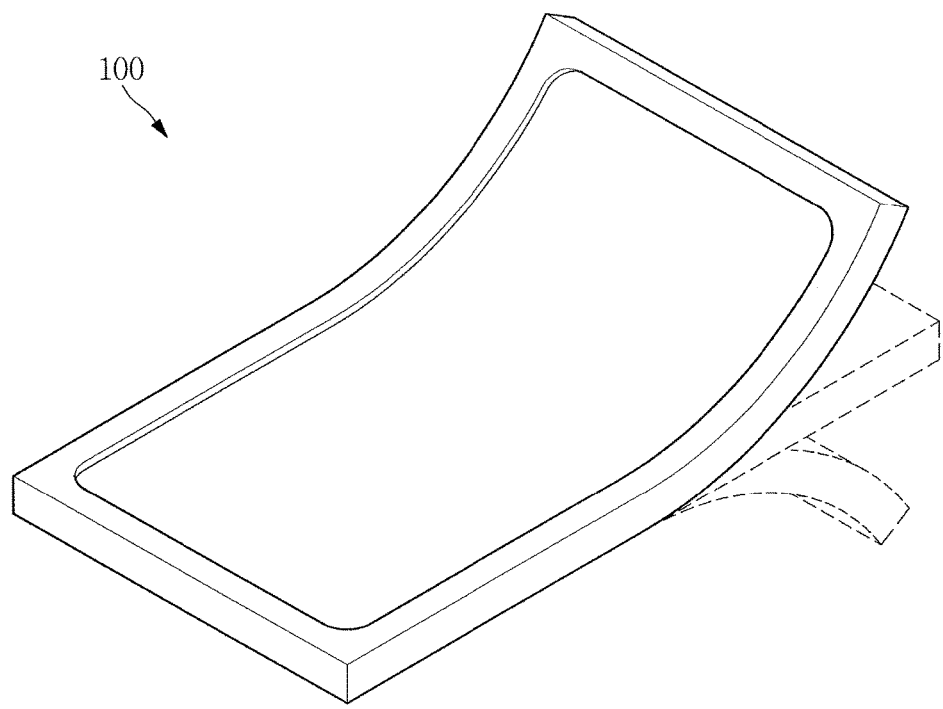
FIG. 1 illustrates a view of an exemplary embodiment of a flexible display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will also be understood that when a layer or element is referred to as being "below" another layer or element, it can be directly below the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments, and like reference numerals refer to like elements throughout the specification.

Hereinafter, one or more exemplary embodiments of a flexible display device will be described with reference to FIGS. 1 to 20.

FIG. 1 is a view illustrating an exemplary embodiment of a flexible display device.

As illustrated in FIG. 1, an exemplary embodiment of a flexible display device 100 is a display device which may be curved or folded. The flexible display device 100 includes a plastic film which may be curved. While being thin, light-weighted, and shock-resistant, such a flexible display device 100 is capable of being curved or folded and thus may be formed into various shapes.

Figure 2:
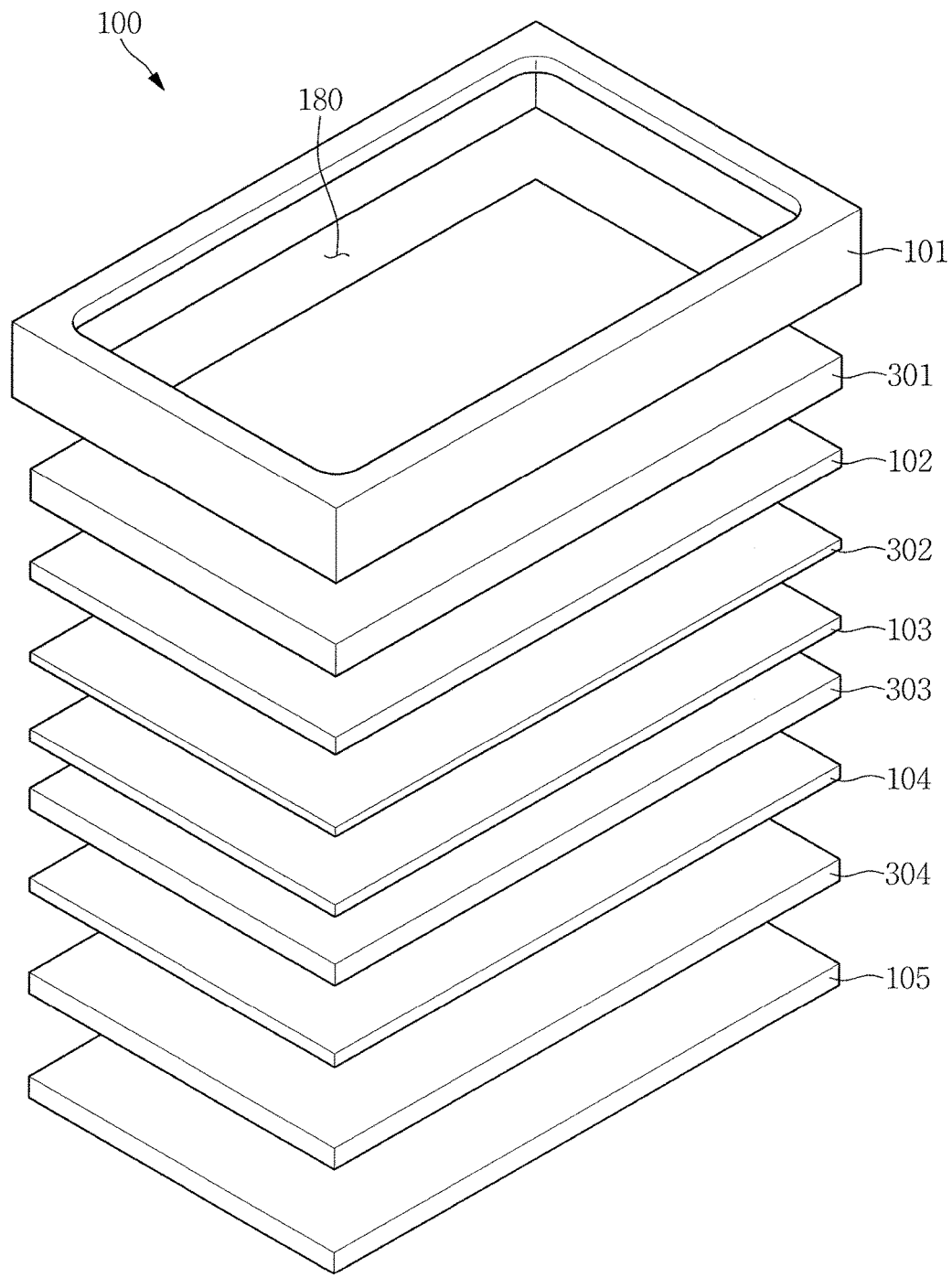
FIG. 2 illustrates an exploded perspective view of the display device of FIG. 1.

FIG. 2 is an exploded perspective view illustrating an exemplary embodiment of the flexible display device 100 of FIG. 1.

As illustrated in FIG. 2, an exemplary embodiment of the flexible display device 100 may include a window cover 101, a touch screen panel 102, a polarizer 103, a display panel 104, and a passivation film 105. In addition, an exemplary embodiment of the flexible display device 100 may include first, second, third, and fourth adhesive films 301, 302, 303, and 304 disposed among respective ones of the aforementioned elements 101, 102, 103, 104, and 105. Each of the adhesive films 301, 302, 303, and 304 may be spaced a predetermined distance apart from one another.

For example, each of the adhesive films 301, 302, 303, and 304 may have substantially a same thickness. In another example, at least two of the adhesive films 301, 302, 303, and 304 may have different thicknesses. For example, the first adhesive film 301 may have a thickness of about 50 μm, the second adhesive film 302 may have a thickness of about 15 μm, the third adhesive film 303 may have a thickness of about 50 μm, and the fourth adhesive film 304 may have a thickness of about 50 μm. In addition, the first, second, third, and fourth adhesive films 301, 302, 303, and 304 may have substantially a same thickness, e.g., about 50 μm.

Each of the adhesive films 301, 302, 303, and 304 are disposed between two adjacent elements to attach the two elements to each other. For example, the first adhesive film 301 is disposed between the window cover 101 and the touch screen panel 102 to attach those to each other, and the second adhesive film 302 is disposed between the touch screen panel 102 and the polarizer 103 to attach those to each other. The third adhesive film 303 is disposed between the polarizer 103 and the display panel 104 to attach those to each other, and the fourth adhesive film 304 is disposed between the display panel 104 and the passivation film 105 to attach those to each other. Each of the adhesive films may be a pressure sensitive adhesive (PSA) film.

The window cover 101 may have, e.g., a quadrangular, frame shape which defines an aperture 180. The window cover 101 is disposed on the first adhesive film 301. The window cover 101 covers side surfaces of the touch screen panel 102, the polarizer 103, the display panel 104, the passivation film 105, and each of the adhesive films 301, 302, 303, and 304. The aperture 180 of the window cover 101 is positioned corresponding to a display area of the display panel 104.

Figure 5:
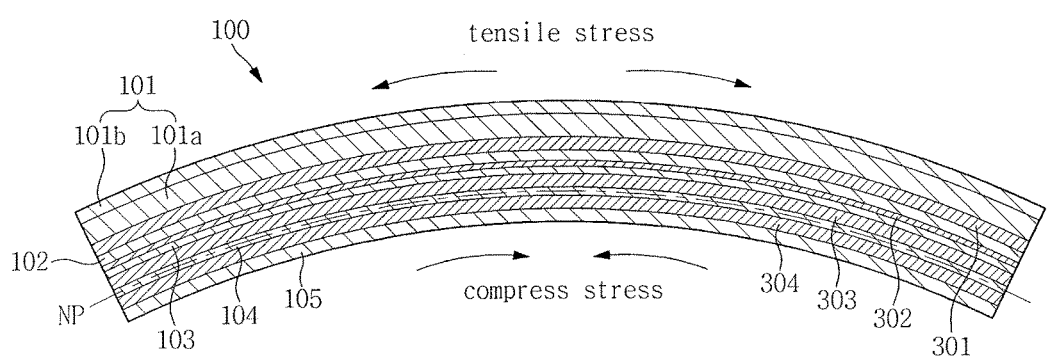
FIG. 5 illustrates a view of a shape of the flexible display device of FIG. 2 when it is curved.

The window cover 101 includes a body portion 101a (refer to FIG. 5) and a coating portion 101b (refer to FIG. 5). The body portion 101a substantially defines a shape of the window cover 101, and the coating portion 101b is coated over an exterior surface of the body portion 101a. The body portion 101a includes a transparent and flexible plastic material. For example, the body portion 101a may include a transparent material, e.g., polyimide. The body portion 101a of the window cover 101 may have a thickness of about 80 μm, and the coating portion 101b of the window cover 101 may have a thickness of about 40 μm.

The touch screen panel 102 is provided on a front surface of the flexible display device 100 to convert a position of an area contacted by a hand of a human or an object into an electric signal. Accordingly, a selected instruction at the contacted area is recognized as an input signal. The touch screen panel 102 may include a flexible material which may be curved or folded. The touch screen panel 102 may be a capacitive touch screen panel or a resistive touch screen panel. The touch screen panel 102 may have a thickness of about 23 μm.

The polarizer 103 may change an optical axis of light transmitted through the display panel 104 to be emitted outwards, i.e., outside the display device 100. The polarizer 103 may include a flexible material that may be curved or bent. For example, the polarizer 103 may include a linear polarizer including a polyvinyl alcohol (PVA)-based resin and a transparent passivation film 105 on either side, both sides, or one side of the linear polarizer.

In particular, the polarizer 103 may include a linear polarizer, which may include a PVA-based molecular chain structure in a predetermined direction and an iodine compound or a dichroic polarizing material, and a triacetyl cellulose (TAC) film, as a transparent passivation film 105, adhering to the linear polarizer. In such an exemplary embodiment, the linear polarizer and the transparent passivation film 105 may be attached to each other by a water-based adhesive including a PVA-based aqueous solution. However, the polarizer 103 may have any suitable structures known in the art rather than the above described structure. The polarizer 103 may have a thickness of about 34 μm.

The display panel 104 displays an image. The display panel 104 may include a plurality of pixels which display a unit image forming the aforementioned image. Each of the pixels may include an organic light emitting diode (OLED). The display panel 104 may include a flexible material that may be curved or bent. The display panel 104 may have a thickness of about 34 μm.

The passivation film 105 is disposed on a rear surface of the display panel 104. The rear surface of the display panel 104 is positioned opposite to the display area of the display panel 104. The passivation film 105 may include a flexible material which may be curved or bent. For example, the passivation film 105 may include an opaque plastic material. For example, the passivation film 105 may include a material, such as opaque polyimide, which has a color. The passivation film 105 may have a thickness of about 50 μm.

Figure 3:
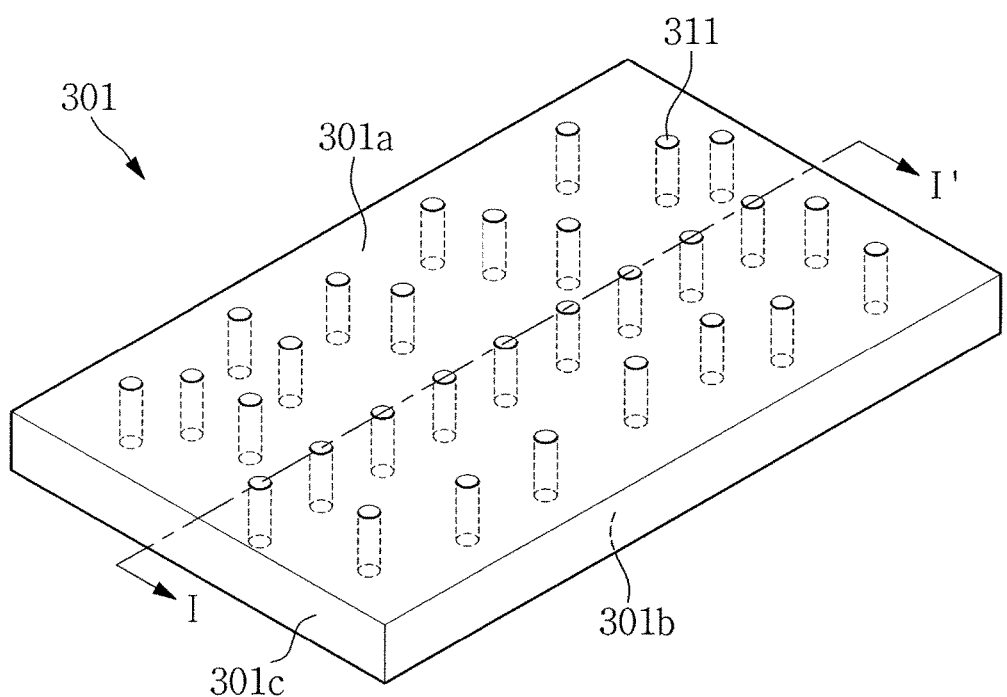
FIG. 3 illustrates a separate view of a first adhesive film of FIG. 1.

Each of the adhesive films 301, 302, 303, and 304 may have at least one hole, which will be described in detail with reference to FIGS. 3 and 4. FIG. 3 is a view separately illustrating the first adhesive film 301 of FIG. 1, and FIG. 4 is a cross-sectional view taken along line I-I' of FIG. 3.

Figure 4:
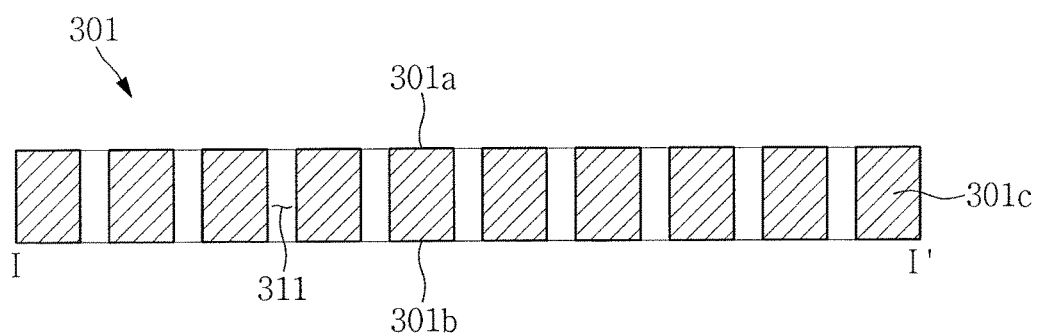
FIG. 4 illustrates a cross-sectional view taken along line I-I' of FIG. 3.

Referring to FIGS. 3-4, the first adhesive film 301 includes a base portion 301c and adhesion surfaces 301a and 301b positioned on opposite sides of the base portion 301c, the adhesion surfaces 301a and 301b are opposite each other. One of the adhesion surfaces 301a and 301b of the first adhesive film 301, e.g., a first adhesion surface 301a, opposes an element (e.g., a window cover 101) adjacent thereto, and the other of the adhesion surfaces 301a and 301b, e.g., a second adhesion surface 301b, opposes another element (e.g., a touch screen panel 102) adjacent thereto.

At least one hole 311 of the first adhesive film 301 passes through the, e.g., entire, base portion 301c and the adhesion surfaces 301a and 301b. Two elements adjacent to each other having the first adhesive film 301 therebetween oppose, e.g., face, each other through the hole 311 of the first adhesive film 301. For example, a portion of the window cover 101 and a portion of the touch screen panel 102 oppose, e.g., face, each other through the hole 311. The hole 311, as illustrated in FIG. 3, may have a circular column shape, e.g., a cylinder shape. However, the shape of the hole 311 is not limited thereto, and the hole 311 may have any suitable shape, e.g., a quadrangular column shape.

The first adhesive film 301 may have two or more holes 311, and in such an exemplary embodiment, a plurality of holes 311 may be defined in the first adhesive film 301 in an irregular manner. At least two of the plurality of holes 311 may have substantially a same depth or different depths. In addition, at least two of the plurality of holes 311 may have substantially a same size (e.g., a diameter) or may have different sizes.

The first adhesive film 301 may include a light transmissive resin that may transmit light. For example, the base portion 301c and the adhesion surfaces 301a and 301b of the first adhesive film 301 may include a light transmissive resin. Any material that has light transmitting characteristics may be used as the first adhesive film 301 without limitation. For example, the first adhesive film 301 may include at least one of a polyimide (PI)-based resin, a polyethylene terephthalate (PET)-based resin, a polyester (PE)-based resin, a polystyrene (PS)-based resin, an acrylic resin, a polycarbonate (PC)-based resin, and a cycloolefin-based polymer (COP).

The first adhesive film 301 may have a refractive index in a range of about 1.4 to about 2.2. In addition, the hole 311 may be filled with gas, e.g., air. In such an exemplary embodiment, the hole 311 filled with air may have a refractive index in a range of about 1.0 to about 1.3. Due to a refractive index difference between the first adhesive film 301 and the hole 311, a light path and a level of light diffusion may change at an inner wall of the hole 311, and thus light transmitted through the first adhesive film 301 may be scattered. Accordingly, light transmitted through the first adhesive film 301 has a high haze value.

Through the light scattering, collimated light and diffused light that are transmitted through the first adhesive film 301 may be efficiently mixed together, and luminance distribution of side light which is emitted towards a side surface may change. Accordingly, a difference between front visibility and side visibility of the flexible display device 100 including the first adhesive film 301 may be reduced, and the side visibility may be improved. In addition, color shift, e.g., white angular dependency (WAD) of a white color, of side light emitted from the flexible display device 100 including the first adhesive film 301 may be reduced.

In an exemplary embodiment, a light scattering characteristic and a haze value of the first adhesive film 301 may be adjusted based on a refractive index of the first adhesive film 301, a diameter of the hole 311, a distance among the holes 311, and a shape of the hole 311.

The first adhesive film 301 may have a thickness t1 in a range of about 20 μm to about 200 μm. In a case where the first adhesive film 301 has a thickness greater than or equal to about 20 μm, the first adhesive film 301 may have stable mechanical properties and thermal-resistant characteristics. In addition, in a case where the first adhesive film 301 has a thickness less than or equal to about 200 μm, the first adhesive film 301 may achieve flexibility, and a flexible display device including the first adhesive film 301 may achieve a thin film structure.

Each of the other adhesive films 302, 303, and 304 may have substantially a same configuration as that of the aforementioned first adhesive film 301. For example, each of the adhesive films 302, 303, and 304 may include the base portion 301c, the adhesion surfaces 301a and 301b, and the at least one hole 311, as illustrated in FIG. 3. In addition, each of the adhesive films 302, 303, and 304 may include the aforementioned light transmissive resin.

In an exemplary embodiment, based on a distance from a neutral plane of the flexible display device 100, at least two adhesive films may have different densities from one another, which will be described in detail with reference to FIGS. 5-6.

FIG. 5 is a view illustrating a shape of the flexible display device 100 when it is curved. FIG. 6 is a cross-sectional view illustrating the display device 100.

First, in a case where the flexible display device 100 is curved into a shape illustrated in FIG. 5, a portion having a greatest radius of curvature is defined as an outer surface of the flexible display device 100, e.g., an outer surface of the window cover 101, and a portion having a smallest radius of curvature is defined as an inner surface of the flexible display device 100, e.g., an inner surface of passivation film 105. In such an exemplary embodiment, tensile stress is caused on the outer surface of the flexible display device 100, and compressive stress is caused on the inner surface of the flexible display device 100. The tensile stress and the compressive stress act in opposite directions from each other.

Each of the adhesive films 301, 302, 303, and 304 may be damaged due to the tensile stress and the compressive stress. For example, in a case where the tensile stress and the compressive stress at a predetermined level or higher are repeatedly generated or maintained for a relatively long period of time, damage, e.g., crack, may occur in each of the adhesive films 301, 302, 303, and 304 by the tensile stress and the compressive stress. The damage may cause deterioration of adhesiveness of the adhesive films 301, 302, 303, and 304. The hole 311 of each of the adhesive films 301, 302, 303, and 304 diminishes the tensile stress and the compressive stress.

In an exemplary embodiment, when the flexible display device 100 maintains a curved shape, there is a neutral plane NP in the flexible display device 100, on which the tensile stress and the compressive stress are exerted at a same level. As the tensile stress and the compressive stress are exerted in opposite directions, a total stress applied to the neutral plane NP is substantially zero (0). In other words, the total, e.g., net force, of the tensile stress and the compressive stress applied to the neutral plane NP is substantially zero (0). As illustrated in FIG. 5, the neutral plane NP may be positioned at the center of the display panel 104, i.e., the neutral plane NP may be an imaginary plane that passes through the center of the display panel 104 and at which a net force of zero (0) is applied during bending, e.g., curving, of the display panel 104. The position of the neutral plane NP is not limited to the center of the display panel 104, and may be adjusted based on materials, thicknesses, and elastic moduli of respective ones of the aforementioned elements 101, 102, 103, 104, and 105 including the adhesive films 301, 302, 303, and 304. Accordingly, by adjusting the control factors, the position of the neutral plane NP of the flexible display device 100 may be adjusted. In other words, by adjusting the materials, thicknesses, and elastic moduli of the layers 101 through 105 and 301 through 304, the position of a plane (i.e., the imaginary neutral plane NP) applied with zero (0) stress during bending may be adjusted within the display device 100.

Figure 6:
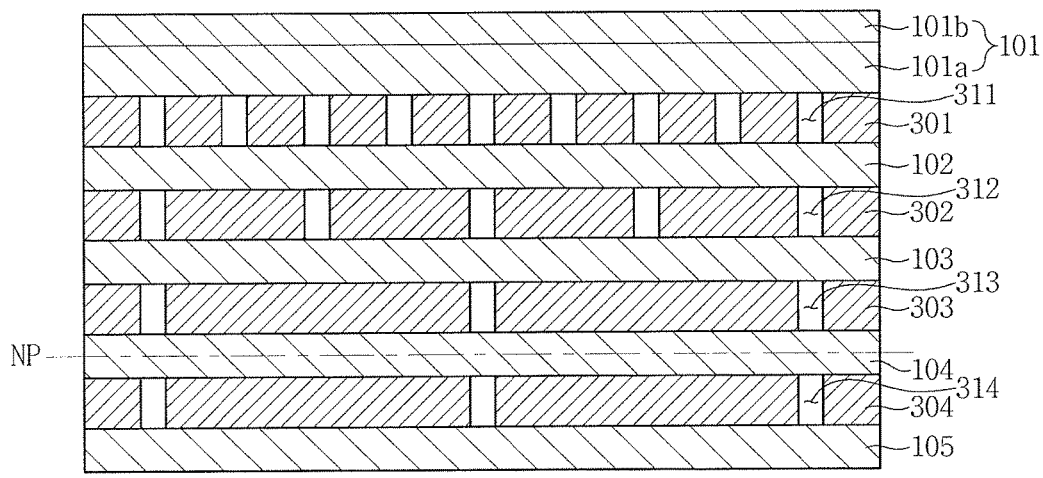
FIG. 6 illustrates a cross-sectional view of the display device of FIG. 2.

Next, referring to FIG. 6, the plurality of adhesive films 301, 302, 303, and 304 may have a decreasing density, as a distance from the neutral plane NP increases. For example, the first adhesive film 301 disposed farthest from the neutral plane NP among the plurality of adhesive films 301, 302, 303, and 304 may have a lowest density, e.g., a largest number of holes therethrough. In another example, the third adhesive film 303 disposed most adjacent to the neutral plane NP among the plurality of adhesive films 301, 302, 303, and 304 may have a highest density, e.g., a lowest number of holes therethrough. In yet another example, the second adhesive film 302 disposed second farthest from the neutral plane NP has a density lower than that of the third adhesive film 303 and higher than that of the first adhesive film 301. In an exemplary embodiment, the fourth adhesive film 304 may have substantially a same density as that of the third adhesive film 303. That is because a distance between the neutral plane NP and the fourth adhesive film 304 is substantially the same as a distance between the neutral plane NP and the third adhesive film 303.

In order to achieve such a density difference among the adhesive films, at least two adhesive films disposed at different distances from the neutral plane NP may have different hole densities from each other. In detail, the plurality of adhesive films 301, 302, 303, and 304 may have a higher hole density, as a distance from the neutral plane NP increases. For example, when it is assumed that volumes, masses, and sizes of holes of respective adhesive films 301, 302, 303, and 304 are substantially the same as one another, the first, second, and third adhesive films 301, 302, and 303 disposed at different distances from the neutral plane NP may have different numbers of holes. For example, as illustrated in FIG. 6, the first adhesive film 301 disposed farthest from the neutral plane NP may have a greatest number of holes 311, and the third adhesive film 303 disposed most adjacent to the neutral plane NP may have a least number of holes 313. In addition, the second adhesive film 302 disposed second farthest from the neutral plane NP may have a number of holes 312 that is greater than that of the holes 313 in the third adhesive film 303 and smaller than that of the holes 311 in the first adhesive film 301. In an exemplary embodiment, the fourth adhesive film 304 may have substantially a same number of holes 314 as that of the third adhesive film 303.

As such, the plurality of adhesive films 301, 302, 303, and 304 may have a lower density, as a distance from the neutral plane NP increases. Accordingly, as a lower density may alleviate stress, e.g., due to a decreased amount of solid material therein adjusted by the holes, stress imposed on each of the adhesive films 301, 302, 303, and 304 when the flexible display device 100 is curved may be reduced, e.g., even in the adhesive films 301, 302, 303, and 304 farther from the neutral plane NP increases.

In an exemplary embodiment, one of two adhesive films that is disposed farther away from the neutral plane NP than the other of the two adhesive films may have a greater number of holes which have a smaller size than that of the other adhesive films, which will be described in detail with reference to FIG. 7.

Figure 7:
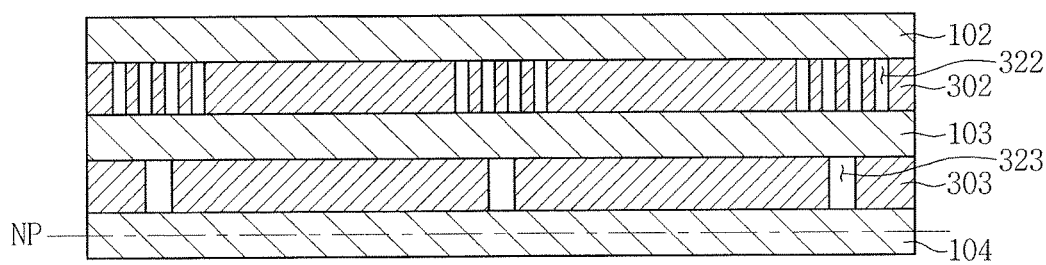
FIG. 7 illustrates a cross-sectional view of two adhesive films.

FIG. 7 is a cross-sectional view illustrating two adhesive films.

FIG. 7 illustrates the second adhesive film 302 and the third adhesive film 303. In an exemplary embodiment, the second adhesive film 302 is disposed relatively farther away from the neutral plane NP, and the third adhesive film 303 is disposed relatively adjacent to the neutral plane NP. The second adhesive film 302 and the third adhesive film 303 may have different numbers and sizes of holes to define respective densities.

In detail, the second adhesive film 302 has a smaller density than that of the third adhesive film 303. To this end, the second adhesive film 302 may have a higher hole density than that of the third adhesive film 303. For example, as illustrated in FIG. 7, the second adhesive film 302 has holes 322 which have a smaller size than those of the third adhesive film 303. In addition, the number of holes 322 defined in the second adhesive film 302 is larger than that of the holes 323 defined in the third adhesive film 303, e.g., so a total volume of holes in the second adhesive film 302 may be larger than that in the third adhesive film 303.

In an exemplary embodiment, each of the adhesive films 301, 302, 303, and 304 may have different volumes and masses. In such an exemplary embodiment, the adhesive films 301, 302, 303, and 304 may have a smaller density, e.g., a larger overall volume of holes therein, as a distance from their position to neutral plane NP increases. To this end, as described hereinabove, at least one of the numbers of and sizes of holes defined in respective corresponding ones of the adhesive films that are disposed at different distances from the neutral plane NP may differ from one another. In other words, adhesive films disposed at different distances from the neutral plane NP may have different hole densities from each other. For example, the adhesive films 301, 302, 303, and 304 may have a higher hole density, as they are positioned farther away from the neutral plane NP.

Figure 8:
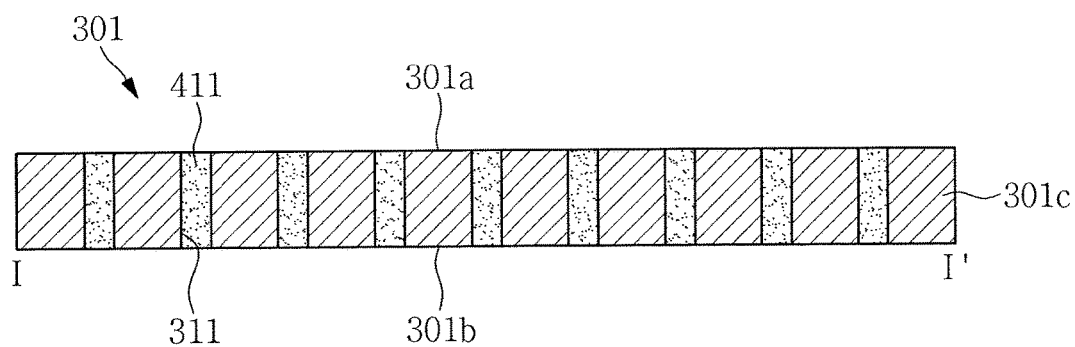
FIG. 8 illustrates a cross-sectional view taken along line I-I' of FIG. 3.

FIG. 8 is a cross-sectional view taken along line I-I' of FIG. 3 according to an exemplary embodiment.

An exemplary embodiment of the flexible display device 100, as illustrated in FIG. 8, may further include an adhesive 411. For example, the adhesive 411 may be disposed in the hole 311 of the first adhesive film 301. The adhesive 411 in the hole 311 of the first adhesive film 301 may have a different refractive index from that of the first adhesive film 301. For example, the adhesive 411 may have a refractive index which is greater than or less than that of the first adhesive film 301.

The adhesive 411 in the hole 311 of the first adhesive film 301 may have substantially a same size as that of the hole 311. In other words, the adhesive 411 may completely fill the hole 311 and may have substantially a same shape as that of the hole 311. For example, the adhesive 411 may have a circular column shape having substantially a same size as that of the hole 311.

Adhesiveness of the first adhesive film 301 may increase due to the adhesive 411. In an exemplary embodiment, a planar area of each of the adhesion surfaces 301a and 301b may be reduced due to the hole 311 passing through the adhesion surfaces 301a and 301b, and thus adhesiveness of the first adhesive film 301 may be deteriorated. In such an exemplary embodiment, the adhesive 411 may complement adhesiveness of the first adhesive film 301. In other words, the adhesive 411 may be inserted into the hole 311 to thereby increase the planar area of each of the adhesion surfaces 301a and 301b.

The adhesive 411 may be inserted into at least one of the holes 311 of the first adhesive film 301. For example, the adhesive 411 may be inserted into the entirety of the holes 311 of the first adhesive film 301. The adhesive 411 may include an adhesion resin.

In an exemplary embodiment, the aforementioned adhesive 411 may further be disposed in holes 312, 313, and 314 respectively defined in other adhesive films 302, 303, and 304. For example, the adhesive 411 may be inserted into the entirety of the holes 312, 313, and 314 of other adhesive films 302, 303, and 304.

Figure 9:
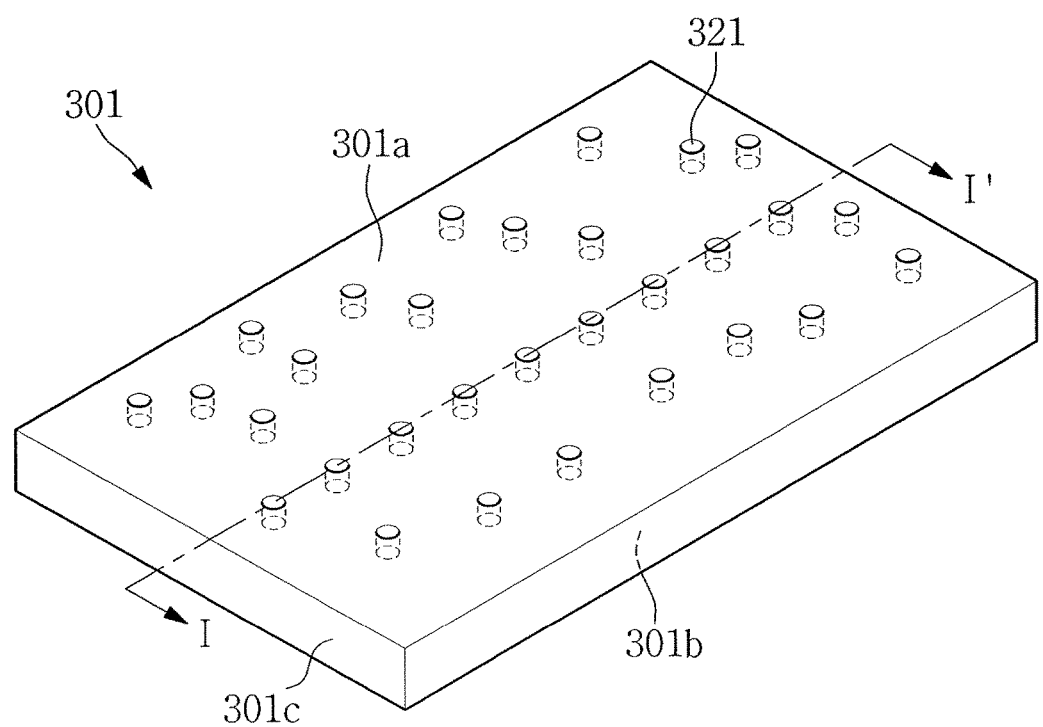
FIG. 9 illustrates a view separately illustrating an alternative exemplary embodiment of a first adhesive film of FIG. 1.
Figure 10:
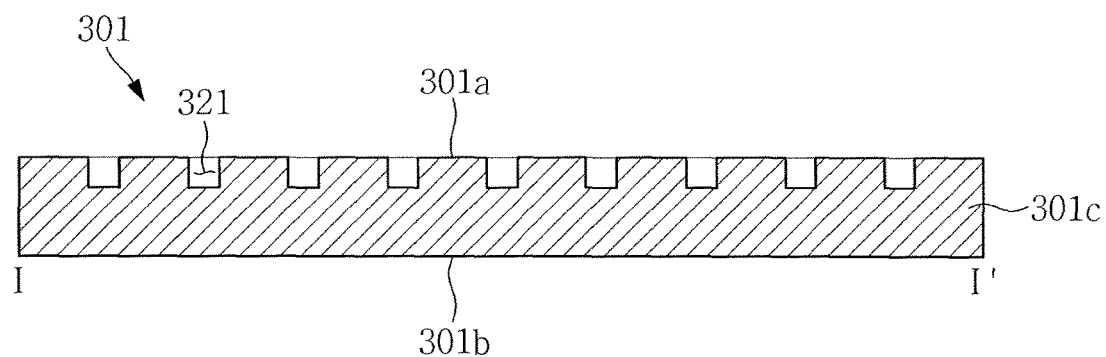
FIG. 10 illustrates a cross-sectional view of an exemplary embodiment taken along line I-I' of FIG. 9.

FIG. 9 is a view separately illustrating an alternative exemplary embodiment of the first adhesive film 301 of FIG. 1, and FIG. 10 is a cross-sectional view illustrating an exemplary embodiment taken along line I-I' of FIG. 9.

As illustrated in FIGS. 9 and 10, an alternative exemplary embodiment of the first adhesive film 301 includes the base portion 301c, the adhesion surfaces 301a and 301b, and at least one groove 321. In such an exemplary embodiment, the groove 321 of the first adhesive film 301 passes through, e.g., only, one of the two adhesion surfaces 301a and 301b. For example, when the two adhesion surfaces 301a and 301b are respectively defined as the first adhesion surface 301a and the second adhesion surface 301b, each of the grooves 321 passes only through the first adhesion surface 301a, e.g., each of the grooves 321 passes only through part of the thickness of the first adhesion surface 301a.

As illustrated in FIG. 9, the groove 321 may have a circular column shape, e.g., a cylinder shape. However, the shape of the groove 321 is not limited thereto, and the groove 321 may have any suitable shape, e.g., a quadrangular column shape.

The first adhesive film 301 may have two or more grooves 321, and in such an exemplary embodiment, the plurality of grooves 321 may be defined in the first adhesive film 301 in an irregular manner. At least two of the plurality of grooves 321 may have substantially a same depth or different depths. In addition, at least two of the plurality of grooves 321 may have substantially a same size (e.g., a diameter) or may have different sizes.

Each of other adhesive films 302, 303, and 304 may have substantially a same configuration as that of the aforementioned first adhesive film 301 of FIG. 9. For example, each of the adhesive films 302, 303, and 304 may include the base portion 301c, the adhesion surfaces 301a and 301b, and the at least one groove 321 as illustrated in FIG. 9.

Due to the groove 321 of FIG. 9, when the flexible display device 100 is curved, stress imposed on each of the adhesive films 301, 302, 303, and 304 may be reduced. When each of the adhesive films 301, 302, 303, and 304 have the groove 321 illustrated in FIG. 9, as described hereinabove, the plurality of adhesive films 301, 302, 303, and 304 may have a lower density, as positioned farther away from the neutral plane NP. To this end, at least two adhesive films have the groove 321, as illustrated in FIG. 9, may respectively have different numbers of the grooves 321, as in FIG. 6. In other words, adhesive films disposed at different distances from the neutral plane NP may have different groove densities. For example, the plurality of adhesive films 301, 302, 303, and 304 may have a higher groove density, as positioned farther away from the neutral plane NP.

Figure 11:
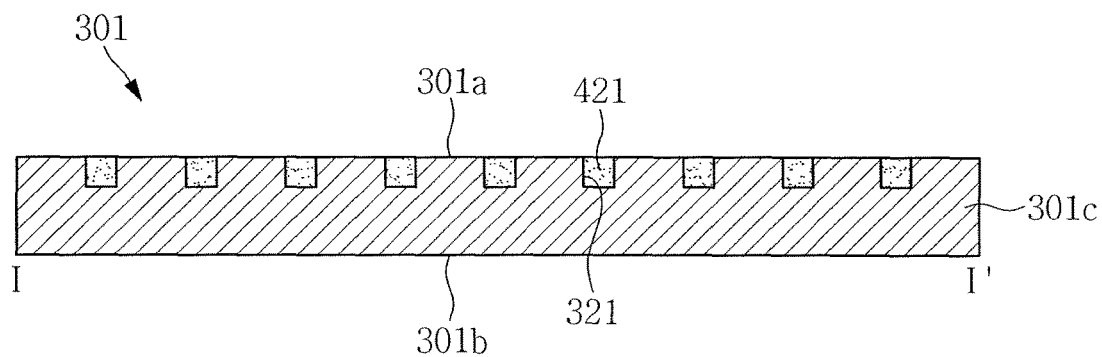
FIG. 11 illustrates a cross-sectional view of an alternative exemplary embodiment taken along line I-I' of FIG. 9.

FIG. 11 is a cross-sectional view illustrating an alternative exemplary embodiment taken along line I-I' of FIG. 9.

An exemplary embodiment of the flexible display device 100 including the adhesive film 301 of FIG. 9, as illustrated in FIG. 11, may further include an adhesive 421. For example, the adhesive 421 may be disposed in the groove 321 of the first adhesive film 301. The adhesive 421 in the groove 321 of the first adhesive film 301 may have a different refractive index from that of the first adhesive film 301. For example, the adhesive 421 may have a refractive index which is greater than or smaller than that of the first adhesive film 301.

The adhesive 421 in the groove 321 of the first adhesive film 301 may have substantially a same size as that of the groove 321. In other words, the adhesive 421 may completely fill the groove 321 and may have substantially a same shape as that of the groove 321. For example, the adhesive 421 may have a circular column shape having substantially a same size as that of the groove 321. In an exemplary embodiment, the aforementioned adhesive 421 may further be disposed in each of the grooves respectively defined in other adhesive films 302, 303, and 304.

Figure 12:
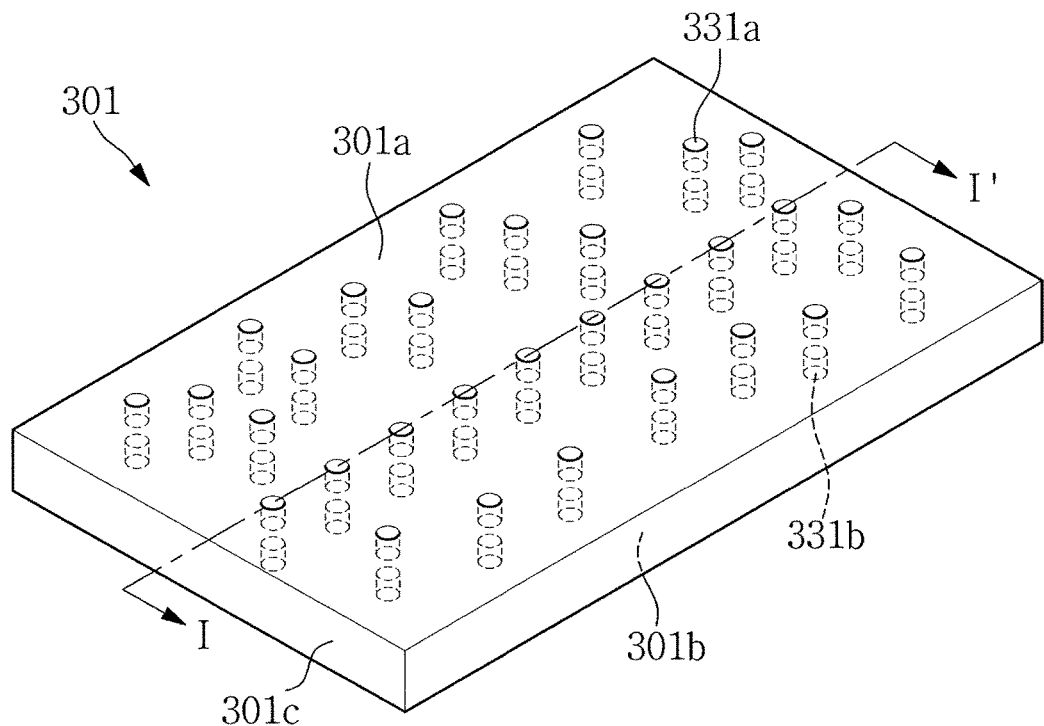
FIG. 12 illustrates a view separately illustrating another alternative exemplary embodiment of a first adhesive film of FIG. 1.
Figure 13:
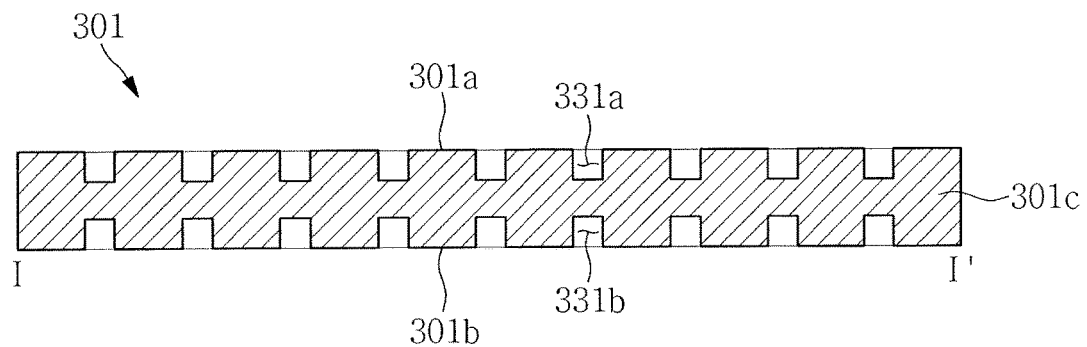
FIG. 13 illustrates a cross-sectional view of an exemplary embodiment taken along line I-I' of FIG. 12.

FIG. 12 is a view separately illustrating another alternative exemplary embodiment of the first adhesive film 301 of FIG. 1, and FIG. 13 is a cross-sectional view illustrating an exemplary embodiment taken along line I-I' of FIG. 12.

As illustrated in FIGS. 12 and 13, another alternative exemplary embodiment of the first adhesive film 301 includes the base portion 301c, the adhesion surfaces 301a and 301b, at least one first groove 331a, and at least one second groove 331b. In such an exemplary embodiment, a first groove 331a of the first adhesive film 301 passes through one of the two adhesion surfaces 301a and 301b, and a second groove 331b of the second adhesive film 302 passes through the other of the two adhesion surfaces 301a and 301b. For example, when the two adhesion surfaces 301a and 301b are respectively defined as a first adhesion surface 301a and a second adhesion surface 301b, the first groove 331a passes through the first adhesion surface 301a and the second groove 331b passes through the second adhesion surface 301b.

As illustrated in FIG. 12, each of the first groove 331a and the second groove 331b may have a circular column shape, e.g., a cylinder shape. However, the shape of the first groove 331a and the second groove 331b is not limited thereto, and the first groove 331a and the second groove 331b may each have any suitable shapes, e.g., a quadrangular column shape.

The first adhesive film 301 may have two or more first grooves 331a, and in such an exemplary embodiment, the plurality of first grooves 331a may be defined on the first adhesion surface 301a of the first adhesive film 301 in an irregular manner. In addition, at least two of the plurality of first grooves 331a may have substantially a same depth or different depths. In addition, at least two of the plurality of first grooves 331a may have substantially a same size (e.g., a diameter) or may have different sizes.

The first adhesive film 301 may have two or more second grooves 331b, and in such an exemplary embodiment, the plurality of second grooves 331b may be defined on the second adhesion surface 301a of the first adhesive film 301 in an irregular manner. In addition, at least two of the plurality of second grooves 331b may have substantially a same depth or different depths. In addition, at least two of the plurality of second grooves 331b may have substantially a same size (e.g., a diameter) or may have different sizes.

The first groove 331a and the second groove 331b may have substantially a same depth with or different depths from each other. In addition, the first groove 331a and the second groove 331b may have substantially a same size (e.g., a diameter) or may have different sizes.

As illustrated in FIG. 12, the first groove 331a and the second groove 331b may be defined to oppose each other, e.g., be aligned along a same vertical line. In an alternative exemplary embodiment, the first groove 331a and the second groove 331b may be defined not to oppose each other. In addition, when a plurality of first grooves 331a and a plurality of second grooves 331b are defined, some of the plurality of first grooves 331a may be defined to oppose the second grooves 331b, and the other of the plurality of first grooves 331a may be defined not to oppose the second grooves 331b.

The first groove 331a and the second groove 331b that are defined to oppose each other may have different depths from each other. In addition, among the first groove 331a and the second groove 331b that do not oppose each other, the total of a depth of the first groove 331a and a depth of the second groove 331b may be greater than a thickness of the base portion 301c. That is, among the first groove 331a and the second groove 331b that do not oppose each other, an inner wall of the first groove 331a and an inner wall of the second groove 331b may overlap each other, e.g., a depth may be larger than half a thickness of the base portion 301c.

Each of other adhesive films 302, 303, and 304 may have substantially a same configuration as that of the aforementioned first adhesive film 301 of FIG. 12. For example, each of the adhesive films 302, 303, and 304 may include the base portion 301c, the adhesion surfaces 301a and 301b, the at least one first groove 331a, and the at least one second groove 331b as illustrated in FIG. 12.

Due to the first groove 331a and the second groove 331b of FIG. 12, when the flexible display device 100 is curved, stress imposed on each of the adhesive films 301, 302, 303, and 304 may be reduced, e.g., due to reduced density caused by the grooves. When each of the adhesive films 301, 302, 303, and 304 have the first groove 331a and the second groove 331b as illustrated in FIG. 12, as described hereinabove, the plurality of adhesive films 301, 302, 303, and 304 may have a lower density, as being positioned farther away from the neutral plane NP. To this end, at least two adhesive films have the first groove 331a and the second groove 331b, as illustrated in FIG. 12, may respectively have different numbers of the first groove 331a and the second groove 331*b*, as in FIG. 6. In other words, adhesive films disposed at different distances from the neutral plane NP may have different groove densities. For example, the plurality of adhesive films 301, 302, 303, and 304 may have a higher groove density, as positioned farther away from the neutral plane NP.

Figure 14:
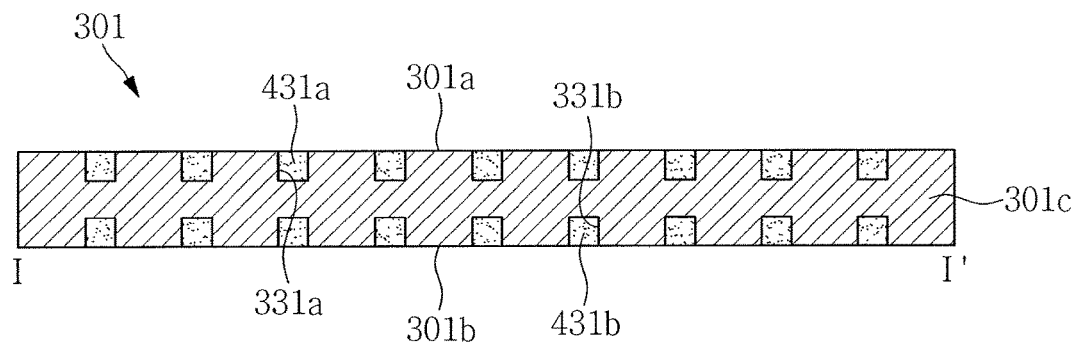
FIG. 14 illustrates a cross-sectional view of an alternative exemplary embodiment taken along line I-I' of FIG. 12.

FIG. 14 is a cross-sectional view illustrating an alternative exemplary embodiment taken along line I-I' of FIG. 12.

An exemplary embodiment of the flexible display device 100 including the adhesive film 301 of FIG. 12, as illustrated in FIG. 14, may further include a first adhesive 431*a* and a second adhesive 431*b*. The first adhesive 431*a* may be disposed in the first groove 331*a* of the first adhesive film 301. The first adhesive 431*a* in the first groove 331*a* of the first adhesive film 301 may have a different refractive index from that of the first adhesive film 301. For example, the first adhesive 431*a* may have a refractive index which is greater than or less than that of the first adhesive film 301.

The first adhesive 431*a* in the first groove 331*a* of the first adhesive film 301 may have substantially a same size as that of the first groove 331*a*. In other words, the first adhesive 431*a* may completely fill the first groove 331*a* and may have substantially a same shape as that of the first groove 331*a*. For example, the first adhesive 431*a* may have a circular column shape having substantially a same size as that of the first groove 331*a*.

The second adhesive 431*b* may be disposed in the second groove 331*b* of the first adhesive film 301. The second adhesive 431*b* in the second groove 331*b* of the first adhesive film 301 may have a different refractive index from that of the first adhesive film 301. For example, the second adhesive 431*b* may have a refractive index which is greater than or smaller than that of the first adhesive film 301.

The second adhesive 431*b* in the second groove 331*b* of the first adhesive film 301 may have substantially a same size as that of the second groove 331*b*. In other words, the second adhesive 431*b* may completely fill the second groove 331*b* and may have substantially a same shape as that of the second groove 331*b*. For example, the second adhesive 431*b* may have a circular column shape having substantially a same size as that of the second groove 331*b*.

In an exemplary embodiment, the aforementioned first adhesive 431*a* and the second adhesive 431*b* may be respectively disposed in the first grooves and the second grooves defined in other adhesive films 302, 303, and 304.

Figure 15:
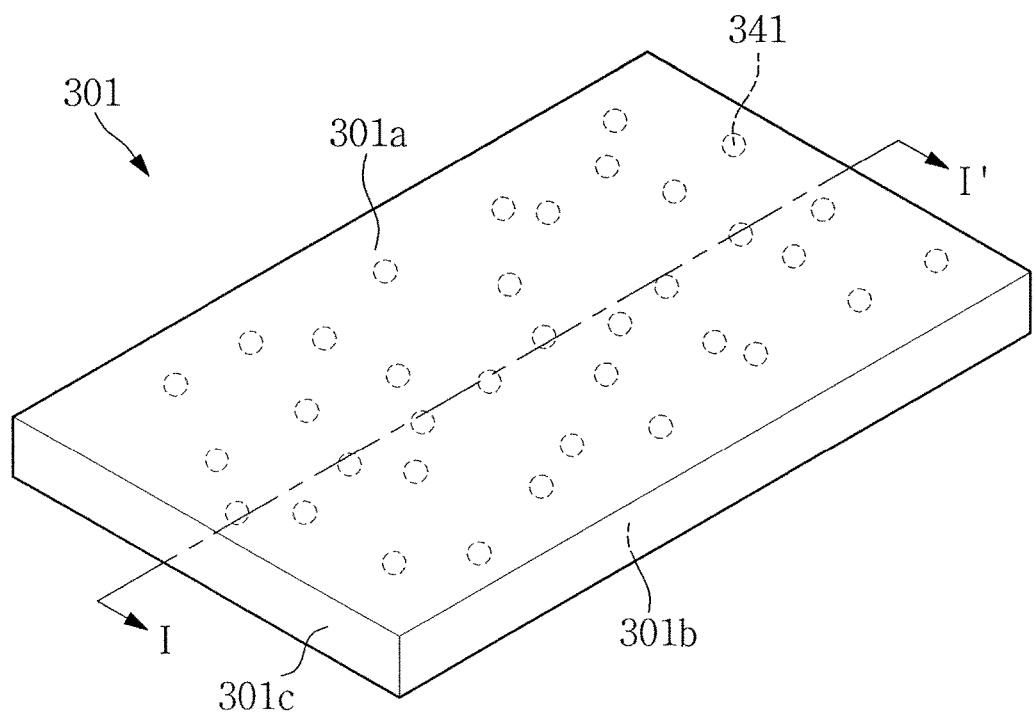
FIG. 15 illustrates a view separately illustrating still another alternative exemplary embodiment of a first adhesive film of FIG. 1.
Figure 16:
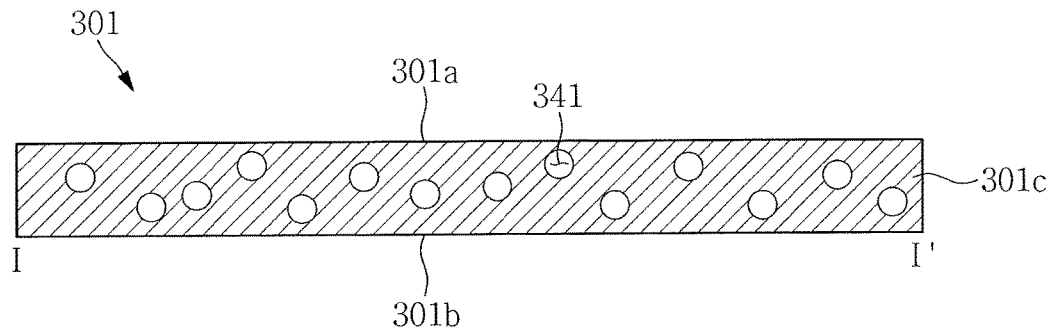
FIG. 16 illustrates a cross-sectional view illustrating an exemplary embodiment taken along line I-I' of FIG. 15.

FIG. 15 is a view separately illustrating still another alternative exemplary embodiment of the first adhesive film 301 of FIG. 1, and FIG. 16 is a cross-sectional view illustrating an exemplary embodiment taken along line I-I' of FIG. 15.

As illustrated in FIGS. 15 and 16, still another alternative exemplary embodiment of the first adhesive film 301 may include the base portion 301*c*, the adhesion surfaces 301*a* and 301*b*, and at least one pore 341. In such an exemplary embodiment, the pore 341 of the first adhesive film 301 may be defined in the first adhesive film 301. For example, the pore 341 may be defined in the base portion 301*c*.

As illustrated in FIG. 15, the pores 341 may each have a sphere shape. However, the shape of the pore 341 is not limited thereto, and the pore 341 may have any suitable shape, e.g., a polyhedron shape.

The first adhesive film 301 may have two or more pores 341, and in such an exemplary embodiment, the plurality of pores 341 may be defined in the base portion 301*c* of the first adhesive film 301 in an irregular manner. At least two of the plurality of pores 341 may have substantially a same size (e.g., a diameter) or may have different sizes.

Each of other adhesive films 302, 303, and 304 may have substantially a same configuration as that of the aforementioned first adhesive film 301 of FIG. 15. For example, each of the adhesive films 302, 303, and 304 may include the base portion 301*c*, the adhesion surfaces 301*a* and 301*b*, and the at least one pore 341 as illustrated in FIG. 15.

Due to the pore 341 of FIG. 15, when the flexible display device 100 is curved, stress imposed on each of the adhesive films 301, 302, 303, and 304 may be reduced. When each of the adhesive films 301, 302, 303, and 304 have the pore 341 as illustrated in FIG. 15, as described hereinabove, the plurality of adhesive films 301, 302, 303, and 304 may have a lower density, as positioned farther away from the neutral plane NP. To this end, at least two adhesive films have the pore 341, as illustrated in FIG. 15, may respectively have different numbers of the pores 341, as in FIG. 6. In other words, adhesive films disposed at different distances from the neutral plane NP may have different pore densities. For example, the plurality of adhesive films 301, 302, 303, and 304 may have a higher pore density, as positioned farther away from the neutral plane NP.

Figure 17:
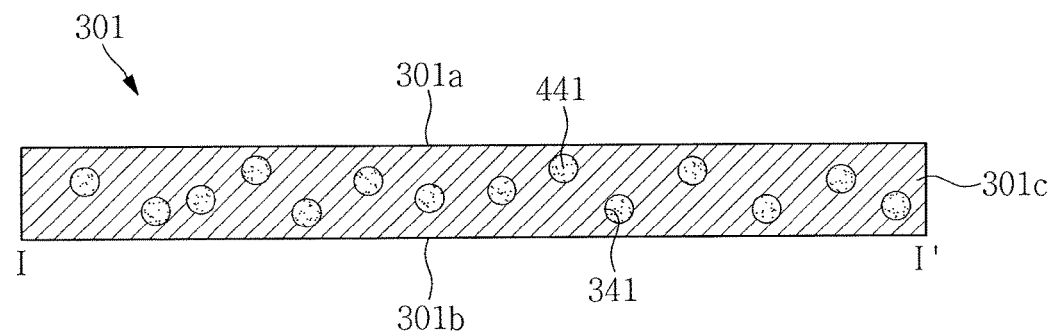
FIG. 17 illustrates a cross-sectional view of still another alternative exemplary embodiment taken along line I-I' of FIG. 15.

FIG. 17 is a cross-sectional view illustrating still another alternative exemplary embodiment taken along line I-I' of FIG. 15.

An exemplary embodiment of the flexible display device 100 including the adhesive film 301 of FIG. 15, as illustrated in FIG. 17, may further include an adhesive 441. For example, the adhesive 441 may be disposed in the pore 341 of the first adhesive film 301. The adhesive 441 in the pore 341 of the first adhesive film 301 may have a different refractive index from that of the first adhesive film 301. For example, the adhesive 441 may have a refractive index which is greater than or smaller than that of the first adhesive film 301.

The adhesive 441 in the pore 341 of the first adhesive film 301 may have substantially a same size as that of the pore 341. In other words, the adhesive 441 may completely fill the pore 341 and may have substantially a same shape as that of the pore 341. For example, the adhesive 441 may have substantially a same size as that of the pore 341.

In an exemplary embodiment, although not illustrated, the aforementioned adhesive 441 may further be disposed in the pores 341 defined in other adhesive films 302, 303, and 304.

Figure 18:
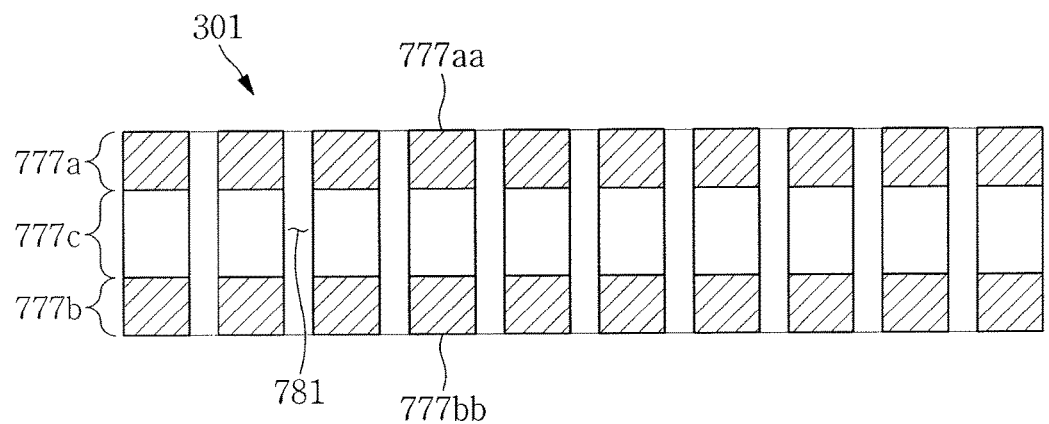
FIG. 18 illustrates a view illustrating an alternative exemplary embodiment of an adhesive film.

FIG. 18 is a view illustrating an alternative exemplary embodiment of an adhesive film.

As illustrated in FIG. 18, the first adhesive film 301 includes a base portion 777*c*, a first adhesion portion 777*a*, and a second adhesion portion 777*b*. The first adhesion portion 777*a* may have a greater thickness than that of the base portion 777*c*. An adhesion surface 777*aa* of the first adhesion portion 777*a* opposes an element (e.g., a window cover 101) adjacent thereto and an adhesion surface 777*b* of the second adhesion portion 777*b* opposes another element (e.g., a touch screen panel 102) adjacent thereto.

A hole 781 of the first adhesive film 301 passes through the base portion 777*c*, the first adhesion portion 777*a*, and the second adhesion portion 777*b*. Two elements adjacent to each other having the first adhesive film 301 therebetween oppose each other through the hole 781 of the first adhesive film 301. For example, a portion of the window cover 101 and a portion of the touch screen panel 102 oppose each other through the hole 781. The hole 781 may be filled with air thereinside.

The adhesive film illustrated in FIG. 18 may have the aforementioned holes 321, 331*a*, 331*b*, and 341 illustrated in one of FIGS. 9, 12, and 15, rather than the hole 781. In addition, the plurality of adhesive films having a configuration of FIG. 18 may have a lower density, as further away from a neutral plane NP, as illustrated in FIG. 6.

Each of other adhesive films 302, 303, and 304 may have substantially a same configuration as that of the first adhesive film 301 illustrated in FIG. 18.

In an exemplary embodiment, when each of a plurality of adhesive films have holes 311, 321, 331a, and 331b that pass through at least one adhesion surface as illustrated in FIGS. 3, 9, 12, and 18, the plurality of adhesive films 301, 302, 303, and 304 may have adhesion surfaces of different planar areas. In detail, the plurality of adhesive films 301, 302, 303, and 304 may have an adhesion surface of a smaller planar area, as positioned farther away from the neutral plane NP. For example, in FIG. 6, an adhesion surface of the first adhesive film 301 facing the window cover 101 has a smaller planar area than that of an adhesion surface of the second adhesive film 302 facing the touch screen panel 102. In such an exemplary embodiment, lengths of transverse sides of respective adhesion surfaces included in the adhesive films may be substantially the same as one another, and lengths of longitudinal sides of respective adhesion surfaces of the adhesive films may be substantially the same as one another.

In an exemplary embodiment, at least one adhesive film may have at least two of the aforementioned hole, groove, and pore. For example, the first adhesive film 301 may have the hole 311, the groove 321, and the pore 341.

Figure 19:
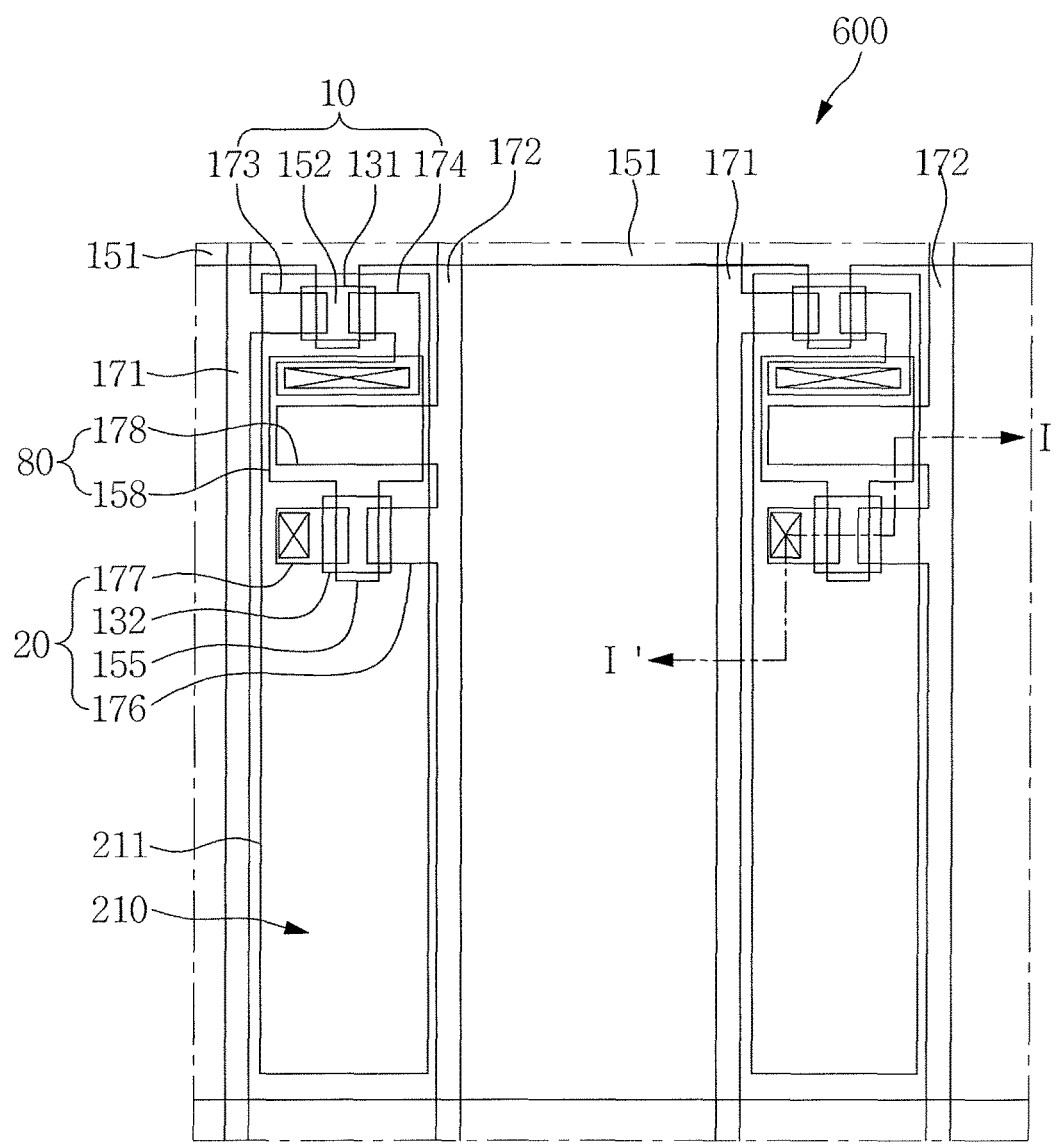
FIG. 19 illustrates a plan view of a pixel included in a display panel of FIG. 1.
Figure 20:
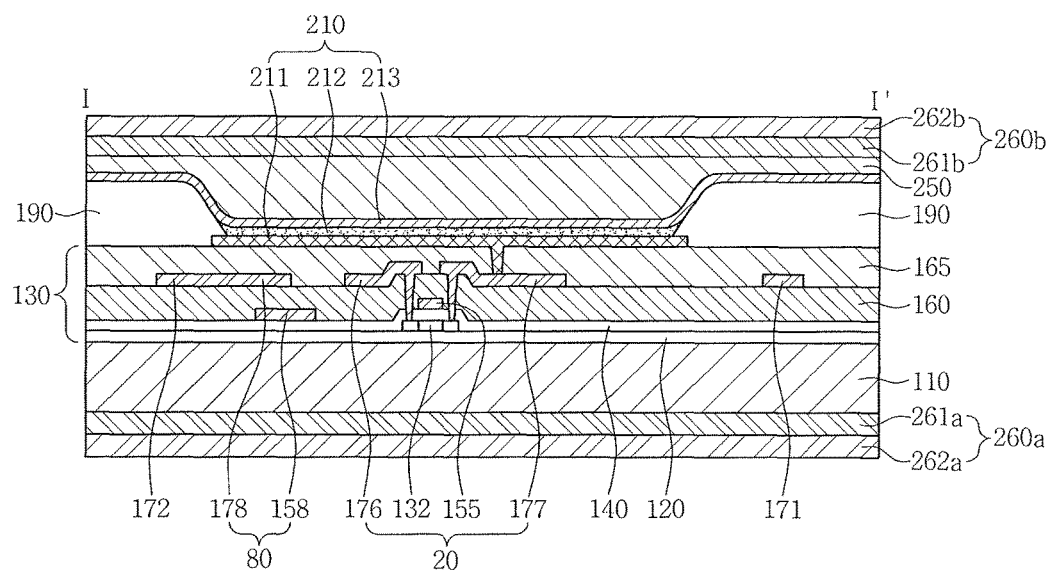
FIG. 20 illustrates a cross-sectional view taken along line I-I' of FIG. 19.

FIG. 19 is a plan view illustrating a pixel included in the display panel 104 of FIG. 1, and FIG. 20 is a cross-sectional view taken along line I-I' of FIG. 19.

As illustrated in FIGS. 19 and 20, the display panel 104 may include a substrate 110, a driving circuit portion 130 on the substrate 110, a display element 210 on the driving circuit portion 130, and a sealing member 250 on the display element 210.

A first coating layer 260a may further be disposed on a rear surface of the substrate 110, and a second coating layer 260b may further be disposed between the sealing member 250 and a touch panel 270. The first coating layer 260a may include at least one of a water-resistant coating layer 261a and a thermal-resistant coating layer 262a, and the second coating layer 260b may include at least one of a water-resistant coating layer 261b and a thermal-resistant coating layer 262b.

The display element 210 may include an organic light emitting diode (OLED).

The driving circuit portion 130 is provided on the substrate 110 to drive the display element 210. The driving circuit portion 130 includes a switching thin film transistor (TFT) 10, a driving TFT 20, and a capacitor 80, and the driving circuit portion 130 drives the OLED of the display element 210.

Although detailed configurations of the driving circuit portion 130 and the display element 210 are illustrated in FIGS. 19 and 20, an exemplary embodiment of the display panel 104 is not limited to the configurations illustrated in FIGS. 19 and 20. The driving circuit portion 130 and the display element 210 may have any suitable structures and be susceptible to modifications those skilled in the pertinent art can easily conceive within the scope.

FIG. 19 illustrates that one pixel includes two TFTs and one capacitor. However, exemplary embodiments are not limited thereto, and one pixel may include three or more TFTs and two or more capacitors and may have various structures including additional wires. Herein, a pixel refers to a smallest unit for displaying an image and may be one of a red pixel R, a green pixel G, and a blue pixel B.

Referring to FIGS. 19 and 20, each pixel includes the switching TFT 10, the driving TFT 20, the capacitor 80, and the display element 210 (hereinafter, OLED). The driving circuit portion 130 refers to a structure including the switching TFT 10, the driving TFT 20, and the capacitor 80.

The driving circuit portion 130 includes a gate line 151 disposed along one direction, a data line 171 insulated from and intersecting the gate line 151, and a common power line 172. A pixel may be typically defined by the gate line 151, the data line 171, and the common power line 172, but the pixel is not limited to the above definition. That is, dissimilar to the above-mentioned structure, the pixel may be defined by a pixel defining layer.

The substrate 110 may use a transparent insulating substrate including, e.g., glass or transparent plastic. For example, the substrate 110 may include at least one of kapton, polyethersulphone (PES), polycarbonate (PC), polyimide (PI), polyethyleneterephthalate (PET), polyethylenenaphthalate (PEN), polyacrylate (PAR), and fiber reinforced plastic (FRP).

A buffer layer 120 may be disposed on the substrate 110. The buffer layer 120 may prevent infiltration of undesirable elements and planarize a surface, and may include suitable materials for planarizing and/or preventing infiltration. For example, the buffer layer 120 may include at least one of a silicon nitride ($SiN_x$) layer, a silicon oxide ($SiO_2$) layer, and a silicon oxynitride ($SiO_xN_y$) layer. However, the buffer layer 120 is not invariably necessary and may be omitted based on kinds of the substrate 110 and process conditions thereof.

A switching semiconductor layer 131 and a driving semiconductor layer 132 are disposed on the buffer layer 120. The switching semiconductor layer 131 and the driving semiconductor layer 132 may include an oxide semiconductor, e.g., a polycrystalline silicon layer, an amorphous silicon layer, indium gallium zinc oxide (IGZO), and indium zinc tin oxide (IZTO). For example, in a case where the driving semiconductor layer 132 illustrated in FIG. 20 includes the polycrystalline silicon layer, the driving semiconductor layer 132 includes a channel region that is not doped with impurities and p+ doped source and drain regions that are formed on opposite sides of the channel region. In such an exemplary embodiment, p-type impurities, such as boron B, may be used as dopant ions and $B_2H_6$ is typically used. Such impurities may vary depending on the kinds of TFTs. An exemplary embodiment of the driving TFT 20 uses a PMOS (p-channel metal oxide semiconductor) TFT using the p-type impurities, but exemplary embodiments are not limited thereto. Thus, the driving TFT 20 may also use an NMOS (n-channel metal oxide semiconductor) TFT or a CMOS (complementary metal oxide semiconductor) TFT.

A gate insulating layer 140 is disposed on the switching semiconductor layer 131 and the driving semiconductor layer 132. The gate insulating layer 140 may include at least one of tetraethylorthosilicate (TEOS), silicon nitride ($SiN_x$), and silicon oxide ($SiO_2$). For example, the gate insulating layer 140 may have a double-layer structure where a $SiN_x$ layer having a thickness of 40 nm and a TEOX layer having a thickness of 80 nm are sequentially stacked.

A gate wiring which includes gate electrodes 152 and 155 is disposed on the gate insulating layer 140. The gate wiring further includes the gate line 151, a first capacitor plate 158, and other lines. In addition, the gate electrodes 152 and 155 are disposed to overlap at least a portion of the semiconductor layers 131 and 132, e.g., channel regions thereof. The gate electrodes 152 and 155 may prevent the channel region from being doped with impurities when source and drain regions 136 and 137 of the semiconductor layers 131 and 132 are doped with impurities during the process of forming the semiconductor layers 131 and 132.

The gate electrodes 152 and 155 and the first capacitor plate 158 are disposed on a same layer and include substantially a same metal material. The gate electrodes 152 and 155 and the first capacitor plate 158 may include at least one of, e.g., molybdenum (Mo), chromium (Cr), and tungsten (W).

An insulating interlayer 160 which covers the gate electrodes 152 and 155 is disposed on the gate insulating layer 140. The insulating interlayer 160 may include, e.g., silicon nitride ($SiN_x$), silicon oxide ($SiO_x$) or tetraethoxysilane (TEOS), similar to the gate insulating layer 140, but exemplary embodiments are not limited thereto.

A data wiring which includes source electrodes 173 and 176 and drain electrodes 174 and 177 is disposed on the insulating interlayer 160. The data wiring further includes the data line 171, the common power line 172, a second capacitor plate 178, and other lines. In addition, the source electrodes 173 and 176 and the drain electrodes 174 and 177 are respectively connected to the source region 136 and the drain region 137 of the semiconductor layers 131 and 132 through a contact hole defined in the gate insulating layer 140 and the insulating interlayer 160.

As such, the switching TFT 10 includes the switching semiconductor layer 131, the switching gate electrode 152, the switching source electrode 173, and the switching drain electrode 174, and the driving TFT 20 includes the driving semiconductor layer 132, the driving gate electrode 155, the driving source electrode 176, and the driving drain electrode 177. Configurations of the TFTs 10 and 20 are not limited to the above embodiments, and thus may be modified into various structures that are known to and can be easily conceived by those skilled in the pertinent art.

The capacitor 80 includes the first capacitor plate 158 and the second capacitor plate 178, having the insulating interlayer 160 interposed therebetween.

The switching TFT 10 may function as a switching element configured to select pixels to perform light emission. The switching gate electrode 152 is connected to the gate line 151. The switching source electrode 173 is connected to the data line 171. The switching drain electrode 174 is spaced apart from the switching source electrode 173 and connected to the first capacitor plate 158.

The driving TFT 20 applies a driving power to the pixel electrode 211, which allows a light emitting layer 212 of the OLED 210 in the selected pixel to emit light. The driving gate electrode 155 is connected to the first capacitor plate 158. The driving source electrode 176 and the second capacitor plate 178 each are connected to the common power line 172. The driving drain electrode 177 is connected to the pixel electrode 211 of the OLED 210 through a contact hole.

With the above-described structure, the switching TFT 10 may be driven by a gate voltage applied to the gate line 151 and serve to transmit a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80, and a current corresponding to the voltage stored in the capacitor 80 flows to the OLED 210 through the driving TFT 20, such that the OLED 210 may emit light.

A planarization layer 165 is disposed on the insulating interlayer 160 so as to cover the data wiring patterned on a same layer including the data line 171, the common power line 172, the source electrodes 173 and 176, the drain electrodes 174 and 177, the second capacitor plate 178, and the like.

The planarization layer 165 may planarize a surface by eliminating or reducing a step difference so as to increase luminance efficiency of the OLED 210 to be formed thereon. The planarization layer 165 may include at least one of, e.g., a polyacrylate resin, an epoxy resin, a phenolic resin, a polyamide resin, a polyimide resin, an unsaturated polyester resin, a polyphenylen ether resin, a polyphenylene sulfide resin, and benzocyclobutene (BCB).

The pixel electrode 211 of the OLED 210 is disposed on the planarization layer 165. The pixel electrode 211 is connected to the drain electrode 177 through the contact hole defined in the planarization layer 165.

A pixel defining layer 190 which exposes at least a portion of the pixel electrode 211 to define a pixel area is disposed on the planarization layer 165. The pixel electrode 211 is disposed corresponding to the pixel region defined by the pixel defining layer 190. The pixel defining layer 190 may include a resin, e.g., a polyacrylate resin and a polyimide resin.

The light emitting layer 212 is disposed on the pixel electrode 211 in the pixel region and a common electrode 213 is disposed on the pixel defining layer 190 and the light emitting layer 212. The light emitting layer 212 includes a low-molecular weight organic material or a high-molecular weight organic material. At least one of a hole injection layer HIL and a hole transporting layer HTL may further be disposed between the pixel electrode 211 and the light emitting layer 212, and at least one of an electron transporting layer ETL and an electron injection layer EIL may further be disposed between the light emitting layer 212 and the common electrode 213.

The pixel electrode 211 and the common electrode 213 may be formed as one of the followings: a transmissive electrode, a transflective electrode, and a reflective electrode.

A transparent conductive oxide (TCO) may be used to form a transmissive electrode. The TCO may include at least one of, e.g., indium tin oxide (ITO), indium zinc oxide (IZO), antimony tin oxide (ATO), aluminum zinc oxide (AZO), zinc oxide (ZnO), and alloys thereof.

A metal, e.g., magnesium (Mg), silver (Ag), gold (Au), calcium (Ca), lithium (Li), chromium (Cr), aluminum (Al), and copper (Cu), or an alloy thereof may be used to form a transflective electrode and a reflective electrode. In such an exemplary embodiment, whether an electrode is a transflective type or a reflective type depends on a thickness of the electrode. Typically, the transflective electrode has a thickness of about 200 nm or less and the reflective electrode has a thickness of about 300 nm or more. As the thickness of the transflective electrode decreases, light transmittance and resistance increases. On the contrary, as the thickness of the transflective electrode increases, the light transmittance decreases.

In addition, the transflective electrode and the reflective electrode may have a multilayer structure which includes a metal layer including a metal or a metal alloy and a TCO layer stacked on the metal layer.

The display panel 104 may have a dual-side light emitting structure where light is emitted toward the pixel electrode 211 and the common electrode 213. In such an exemplary embodiment, both of the pixel electrode 211 and the common electrode 213 may be formed into a transmissive type or a transflective type.

The sealing member 250 is disposed on the common electrode 213 to be spaced apart from the second electrode 213. The sealing member 250 may use a transparent insulating substrate including glass or transparent plastic. In addition, the sealing member 250 may have a thin film encapsulation structure in which one or more inorganic layers and one or more organic layers are alternately stacked.

The water-resistant coating layers 261a and 261b may use a polymer material having transparent properties. For example, the water-resistant coating layers 261a and 261b may use polyester and parylene. The water-resistant coating layers 261a and 261b may be coated in a thermal diffusion deposition method at room temperature or attached as a film shape. Further, an exemplary embodiment of the water-resistant coating layers 261a and 261b may use any water-resistant coating materials typically used by those skilled in the pertinent art.

The thermal-resistant coating layers 262a and 262b may use a material having transparent properties and high thermal conductivity. For example, the thermal-resistant coating layers 262a and 262b may use a graphite sheet and an acryl sheet. In addition, an exemplary embodiment of the thermal-resistant coating layers 262a and 262b may use any thermal-resistant coating materials typically used by those skilled in the pertinent art.

By way of summation and review, when a flexible display device is folded, large stress is applied to a folded portion (a curved portion) thereof. Due to such stress, adhesive films included in the flexible display device may be damaged.

In contrast, according to embodiments, a flexible display device may be provided with an adhesive film capable of resisting such damage. That is, as set forth above, a flexible display device according to one or more exemplary embodiments may include an adhesive film have at least one hole including a medium (e.g., air) therein having a different refractive index from that of the adhesive film. Accordingly, in the flexible display device including such an adhesive film, a difference between front visibility and side visibility may be reduced, and the side visibility may be improved. In addition, color shift, e.g., white angular dependency (WAD), of side light which is emitted from the flexible display device including the adhesive film may be reduced. Further, the plurality of adhesive films have a lower density, as positioned farther away from a neutral plane. Accordingly, when the flexible display device is curved, stress imposed on each of the adhesive films may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A flexible display device, comprising:
   a display panel, the display panel including a display surface and a rear surface opposite each other; and
   a plurality of adhesive films on at least one of the display surface and the rear surface, each of the plurality of adhesive films including at least one hole,
   wherein the plurality of adhesive films have a decreasing density, as a distance from a neutral plane of the flexible display device increases, the neutral plane being a plane where a compressive stress and an opposing tensile stress have a net stress of zero, and
   wherein the plurality of adhesive films have a greater number of holes, as the distance from the neutral plane of the flexible display device increases.

2. The flexible display device as claimed in claim 1, wherein:
   at least two of the plurality of adhesive films have different densities from one another due to the at least one hole, and
   the plurality of adhesive films have a higher hole density, as the distance from the neutral plane of the flexible display device increases.

3. The flexible display device as claimed in claim 2, wherein each of the holes of the plurality of adhesive films has substantially a same size.

4. The flexible display device as claimed in claim 1, wherein each of the plurality of adhesive films includes:
   a first adhesion surface;
   a second adhesion surface; and
   a base portion between the first adhesion surface and the second adhesion surface.

5. The flexible display device as claimed in claim 4, wherein the at least one hole passes through the first adhesion surface, the base portion, and the second adhesion surface in each one of the plurality of adhesive films.

6. The flexible display device as claimed in claim 1, wherein the neutral plane is positioned in the display panel.

7. The flexible display device as claimed in claim 1, further comprising an adhesive inserted into the at least one hole in each one of the plurality of adhesive films.

8. The flexible display device as claimed in claim 7, wherein the adhesive has a refractive index different from that of a corresponding adhesive film of the plurality of adhesive films.

9. The flexible display device as claimed in claim 7, wherein the adhesive has a substantially same size as that of the hole.

10. The flexible display device as claimed in claim 1, wherein the plurality of adhesive films have adhesion surfaces of a smaller planar area, as the distance from the neutral plane of the flexible display device increases.

11. The flexible display device as claimed in claim 1, wherein the at least one hole in each one of the plurality of adhesive films extends through an entirety of a thickness of a corresponding adhesive film.

12. The flexible display device as claimed in claim 1, wherein the at least one hole in each one of the plurality of adhesive films extends only partially through a thickness of a corresponding adhesive film to define a groove.

13. The flexible display device as claimed in claim 1, wherein the at least one hole in each one of the plurality of adhesive films is a pore embedded within a corresponding adhesive film.

14. A flexible display device, comprising:
   a display panel, the display panel including a display surface and a rear surface opposite each other; and
   a plurality of adhesive films on at least one of the display surface and the rear surface, each of the plurality of adhesive films including at least one groove, wherein the plurality of adhesive films have a decreasing density, as a distance from a neutral plane of the flexible display device increases, the neutral plane being a plane where a compressive stress and an opposing tensile stress have a net stress of zero, and wherein the plurality of adhesive films have a greater number of grooves, as the distance from the neutral plane of the flexible display device increases.

15. The flexible display device as claimed in claim 14, wherein:
   at least two of the plurality of adhesive films have different densities from one another due to the at least one groove, and
   the plurality of adhesive films have a higher groove density, as the distance from the neutral plane of the flexible display device increases.

16. The flexible display device as claimed in claim 14, wherein each of the plurality of adhesive films includes:
   a first adhesion surface;
   a second adhesion surface; and
   a base portion between the first adhesion surface and the second adhesion surface.

17. The flexible display device as claimed in claim 16, wherein the at least one groove passes through only one of the first adhesion surface and the second adhesion surface.

18. The flexible display device as claimed in claim 16, wherein the at least one groove includes:
   a first groove passing through the first adhesion surface; and
   a second groove passing through the second adhesion surface.

19. The flexible display device as claimed in claim 18, wherein the first groove and the second groove oppose each other.

20. The flexible display device as claimed in claim 14, wherein the plurality of adhesive films have adhesion surfaces of a smaller planar area, as the distance from the neutral plane of the flexible display device increases.

21. A flexible display device, comprising:
   a display panel, the display panel including a display surface and a rear surface opposite each other; and
   a plurality of adhesive films on at least one of the display surface and the rear surface, each of the plurality of adhesive films including at least one pore,
   wherein the plurality of adhesive films have a decreasing density, as a distance from a neutral plane of the flexible display device increases, the neutral plane being a plane where a compressive stress and an opposing tensile stress have a net stress of zero, and
   wherein the plurality of adhesive films have a greater number of pores, as the distance from the neutral plane of the flexible display device increases.

22. The flexible display device as claimed in claim 21, wherein:
   at least two of the plurality of adhesive films have different densities from one another due to the at least one pore, and
   the plurality of adhesive films have a higher pore density, as the distance from the neutral plane of the flexible display device increases.

23. The flexible display device as claimed in claim 21, wherein each of the plurality of adhesive films includes:
   a first adhesion surface;
   a second adhesion surface; and
   a base portion between the first adhesion surface and the second adhesion surface.

24. The flexible display device as claimed in claim 23, wherein the at least one pore is positioned within the base portion.

* * * * *